United States Patent
Zhang et al.

(10) Patent No.: US 10,700,706 B2
(45) Date of Patent: Jun. 30, 2020

(54) MEMORY SYSTEM WITH DECODERS AND METHOD OF OPERATING SUCH MEMORY SYSTEM AND DECODERS

(71) Applicant: SK hynix Inc., Gyeonggi-do (KR)

(72) Inventors: Fan Zhang, Fremont, CA (US); Aman Bhatia, San Jose, CA (US); Chenrong Xiong, San Jose, CA (US); Naveen Kumar, San Jose, CA (US); Yu Cai, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 16/128,102

(22) Filed: Sep. 11, 2018

(65) Prior Publication Data

US 2019/0097653 A1 Mar. 28, 2019

Related U.S. Application Data

(60) Provisional application No. 62/562,139, filed on Sep. 22, 2017.

(51) Int. Cl.
*H03M 13/11* (2006.01)
*H03M 13/15* (2006.01)
(Continued)

(52) U.S. Cl.
CPC ..... *H03M 13/1108* (2013.01); *G06F 11/1012* (2013.01); *G11C 29/14* (2013.01);
(Continued)

(58) Field of Classification Search
CPC ................................................ H03M 13/1108
See application file for complete search history.

(56) References Cited

U.S. PATENT DOCUMENTS 8,495,479 B1 * 7/2013 Varnica .............. H03M 13/1111
714/780
9,270,296 B1 * 2/2016 Nemati Anaraki .........................
G06F 11/1008
(Continued)

FOREIGN PATENT DOCUMENTS

KR 101009170 1/2011
KR 101103974 1/2012

OTHER PUBLICATIONS

Cai, Y., et al., "Error Characterization, Mitigation, and Recovery in Flash-Memory-Based Solid-State Drives," Proceedings of the IEEE (vol. 105, Issue: 9, pp. 1666-1704), Date of Publication: Aug. 18, 2017 (Year: 2017).*

(Continued)

*Primary Examiner* — Kyle Vallecillo
*Assistant Examiner* — Jonathan Chang
(74) *Attorney, Agent, or Firm* — IP & T Group LLP

(57) ABSTRACT

A memory system, a controller including a bit-flipping (BF) decoder and a min-sum (MS) decoder that may be included in the memory system and operating methods thereof in which the controller determines a quality metric as a function of initial syndrome weight and information of the BF decoder after a set number of decoding iterations by the BF decoder in a test period. After the test period, the controller applies the quality metric to each codeword to determine whether to send that codeword first to the BF decoder for decoding or directly to the MS decoder for decoding.

20 Claims, 8 Drawing Sheets

(51) Int. Cl.

| | | |
|---|---|---|
| *H03M 13/37* | (2006.01) | |
| *G06F 11/10* | (2006.01) | |
| *G11C 29/52* | (2006.01) | |
| *G11C 29/44* | (2006.01) | |
| *G11C 29/14* | (2006.01) | |
| *G11C 29/42* | (2006.01) | |
| *G11C 29/04* | (2006.01) | |

(52) U.S. Cl.
CPC ............. *G11C 29/42* (2013.01); *G11C 29/44* (2013.01); *G11C 29/52* (2013.01); *H03M 13/112* (2013.01); *H03M 13/1117* (2013.01); *H03M 13/1575* (2013.01); *H03M 13/3707* (2013.01); *H03M 13/3715* (2013.01); *G11C 2029/0411* (2013.01); *G11C 2029/4402* (2013.01)

(56) References Cited

U.S. PATENT DOCUMENTS

| | | | | |
|---|---|---|---|---|
| 9,294,132 | B1* | 3/2016 | Peleato-Inarrea | H03M 13/2948 |
| 9,329,935 | B2* | 5/2016 | Cohen | G06F 11/1076 |
| 10,102,066 | B2* | 10/2018 | Cho | G06F 3/0619 |
| 10,263,644 | B1* | 4/2019 | Mazahreh | H03M 13/1108 |
| 2010/0042891 | A1* | 2/2010 | Gunnam | H03M 13/1111 |
| | | | | 714/752 |
| 2011/0032758 | A1* | 2/2011 | Son | G06F 11/1072 |
| | | | | 365/185.03 |
| 2012/0005551 | A1* | 1/2012 | Gunnam | H03M 13/1108 |
| | | | | 714/752 |
| 2012/0185744 | A1* | 7/2012 | Varnica | H03M 13/1108 |
| | | | | 714/752 |
| 2015/0188570 | A1* | 7/2015 | Kwok | G06F 11/1076 |
| | | | | 714/764 |
| 2015/0227314 | A1* | 8/2015 | Chen | G06F 11/1012 |
| | | | | 714/764 |
| 2015/0263760 | A1* | 9/2015 | Hof | H03M 13/3707 |
| | | | | 714/758 |
| 2015/0381206 | A1* | 12/2015 | Fainzilber | H03M 13/1108 |
| | | | | 714/758 |
| 2016/0094247 | A1* | 3/2016 | Parthasarathy | H03M 13/2927 |
| | | | | 714/755 |
| 2017/0160931 | A1* | 6/2017 | Thakkar | G06F 3/061 |
| 2017/0160932 | A1* | 6/2017 | Thakkar | G06F 3/061 |
| 2017/0288698 | A1* | 10/2017 | Du | H03M 13/1108 |
| 2017/0310342 | A1* | 10/2017 | Yen | H03M 13/3715 |
| 2018/0048332 | A1* | 2/2018 | Kumar | H03M 13/2906 |
| 2018/0175882 | A1* | 6/2018 | Hanham | H03M 13/1108 |
| 2019/0087264 | A1* | 3/2019 | Tokutomi | H03M 13/152 |
| 2019/0089384 | A1* | 3/2019 | Kumano | H03M 13/2906 |

OTHER PUBLICATIONS

Zuolo, L. et al., "Solid-State Drives: Memory Driven Design Methodologies for Optimal Performance," Proceedings of the IEEE (vol. 105, Issue: 9, pp. 1589-1608), Date of Publication: Aug. 11, 2017 (Year: 2017).*

* cited by examiner

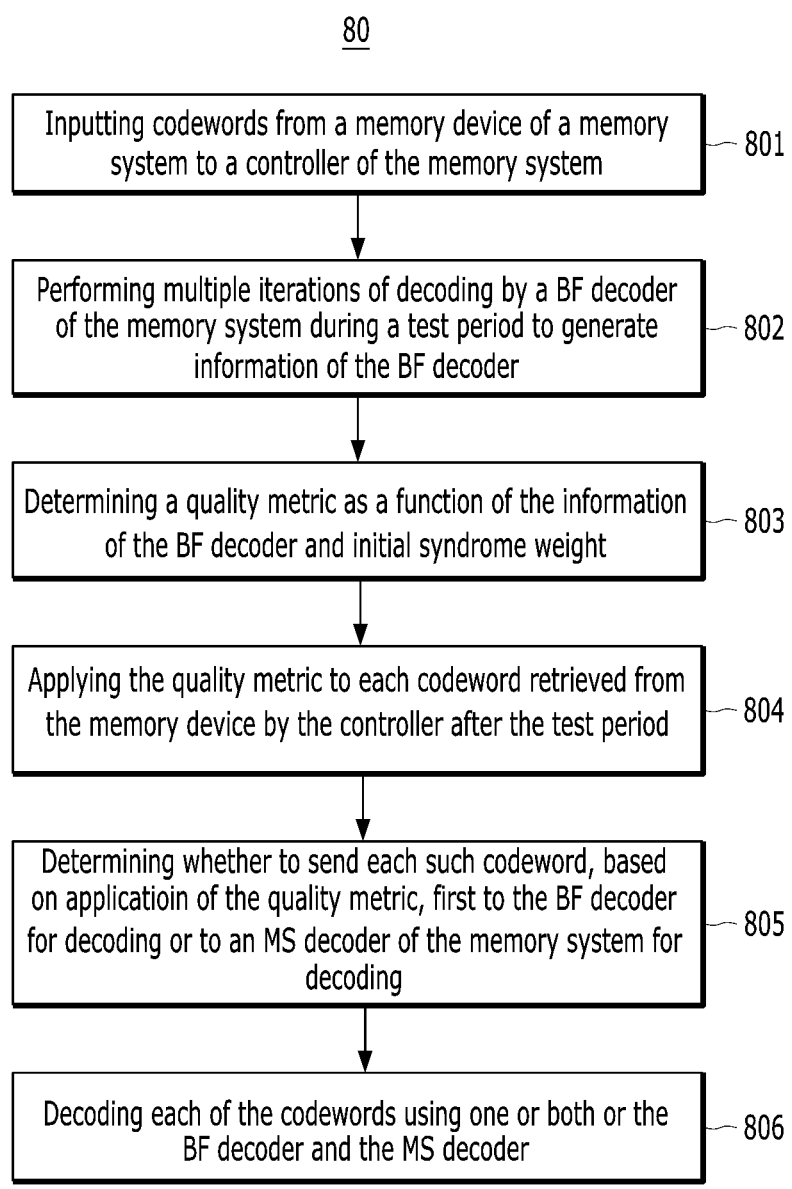

MEMORY SYSTEM WITH DECODERS AND METHOD OF OPERATING SUCH MEMORY SYSTEM AND DECODERS

CROSS-REFERENCE TO RELATED APPLICATION(S)

This application claims the benefit of U.S. Provisional Application No. 62/562,139, filed Sep. 22, 2017, the entire contents of which are incorporated herein by reference.

BACKGROUND

1. Field

Embodiments of the present disclosure relate to a memory system with decoders, and method of operating such system and decoders, particularly to predict decoding failure.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated.

The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

NAND flash-based storage devices have been widely adopted because of their faster read/write performance, lower power consumption, and shock proof features. In general, however, they are more expensive compared to hard disk drives (HDD). To bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional Bose-Chaudhuri-Hocquenghem (BCH) codes to overcome the associated noises and interferences, and thus improve the data integrity. One such ECC is low-density parity-check (LDPC) code. Various algorithms can be utilized for decoding LDPC codes more accurately and faster.

There are different iterative decoding algorithms for LDPC codes and associated decoders, such as bit-flipping (BF) decoding algorithms, belief-propagation (BP) decoding algorithms, sum-product (SP) decoding algorithms, min-sum (MS) decoding algorithms, Min-Max decoding algorithms, etc. Some offer speed, while others are more capable at higher noise levels. Multiple decoding algorithms may be used in a particular system to enable different codewords to be decoded using different decoders depending on conditions such as noise level and interference.

In this context, embodiments of the present invention arise.

SUMMARY

Aspects of the present invention include memory systems. Such a memory system comprises a memory device; and a controller in communication with, and configured to control, the memory device. The memory system or the controller thereof comprises a storage configured to store codewords read by the controller from the memory device, a bit-flipping (BF) decoder in communication with the storage, and a min-sum (MS) decoder in communication with the storage. In a test period, the controller is configured to determine a quality metric as a function of initial syndrome weight and information of the BF decoder after a set number of decoding iterations by the BF decoder. After the test period, the controller is configured to apply the quality metric to each codeword retrieved after the test period to determine whether to send that codeword first to the BF decoder for decoding or to the MS decoder for decoding.

Further aspects of the present invention includes controllers. Such a controller comprises a storage configured to store codewords read by the controller from a memory device; and a decoding assembly in communication with the storage, the decoding assembly comprising a bit-flipping (BF) decoder and a min-sum (MS) decoder. In a test period, the controller is configured to determine a quality metric as a function of initial syndrome weight and information of the BF decoder after a set number of decoding iterations by the BF decoder. After the test period, the controller is configured to apply the quality metric to each codeword retrieved after the test period to determine whether to send that codeword first to the BF decoder for decoding or to the MS decoder for decoding.

Additional aspects of the present invention include methods, particularly methods of operating memory systems including or associated with decoders. Such a method of operating a memory system comprises inputting codewords from a memory device of the memory system to a controller of the memory system; performing multiple iterations of decoding by a bit-flipping (BF) decoder of the memory system during a test period to generate information of the BF decoder; determining a quality metric as a function of the information of the BF decoder and initial syndrome weight; applying the quality metric to each codeword retrieved from the memory device by the controller after the test period; and determining whether to send each codeword, based on the applying, first to the BF decoder for decoding or to a min-sum (MS) decoder of the memory system for decoding.

Other features, aspects and advantages of the present invention will become clear in view of the following description and accompanying the drawings.

BRIEF DESCRIPTION OF THE DRAWINGS

FIG. 8 is a flowchart of steps in a method of decoding in accordance with an embodiment of the present invention.

DETAILED DESCRIPTION

Figure 1:
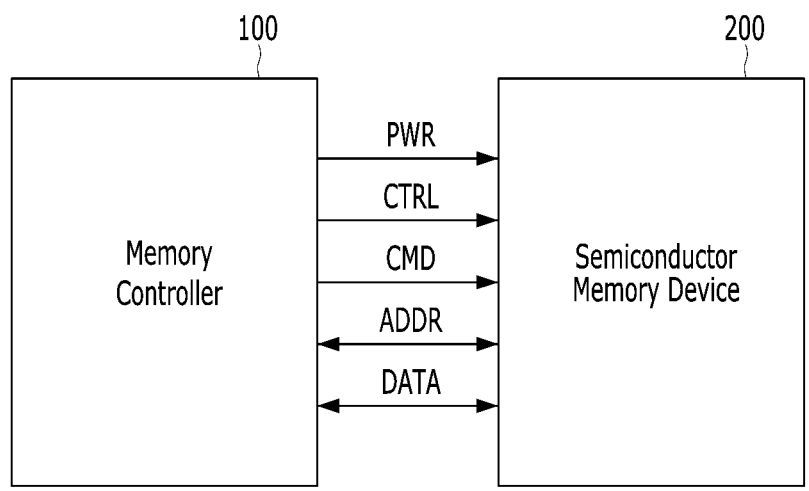
FIG. 1 is a block diagram schematically illustrating a memory system in accordance with an embodiment of the present invention.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases is not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims, and the invention encompasses numerous alternatives, modifications and equivalents. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s).

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
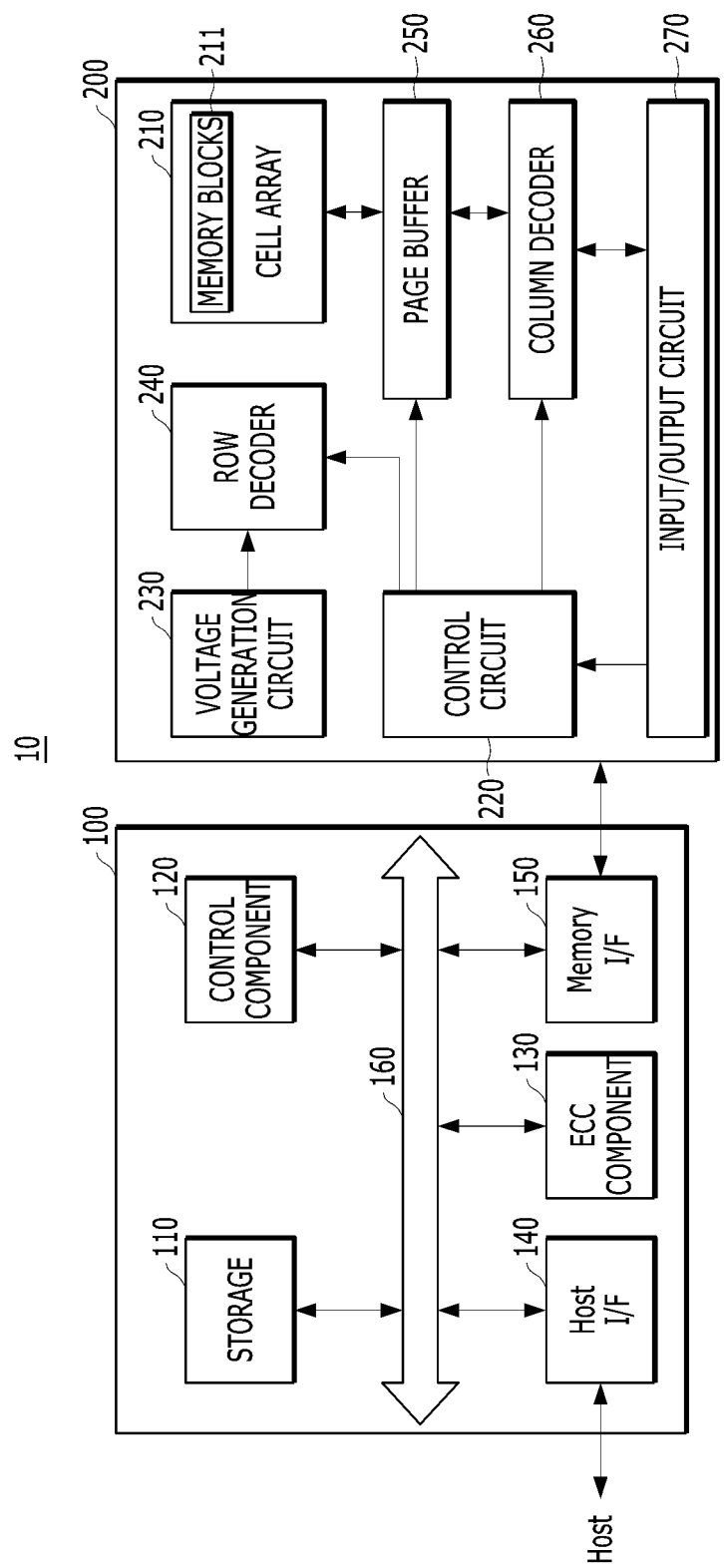
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
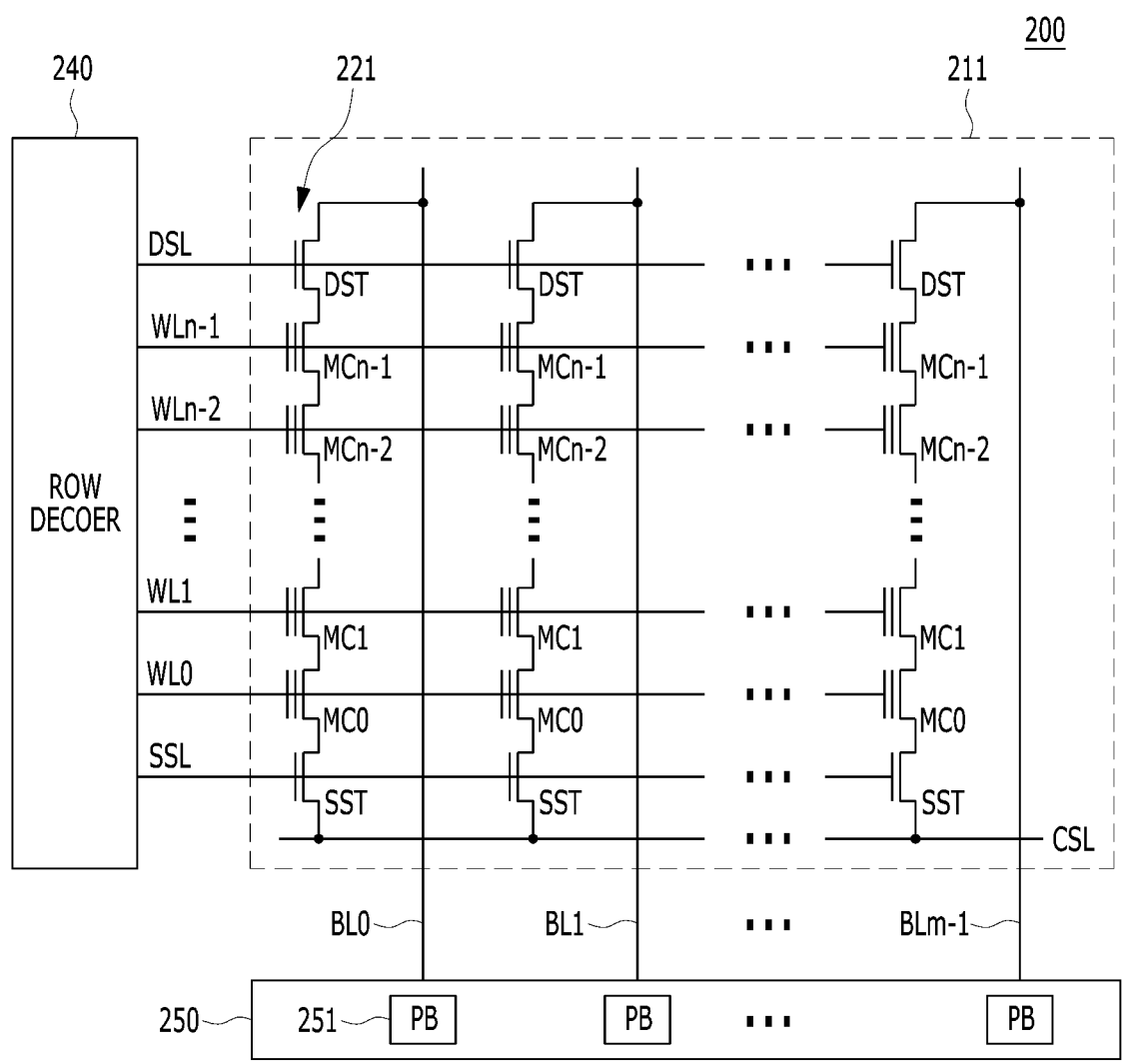
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit/receive data to/from the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
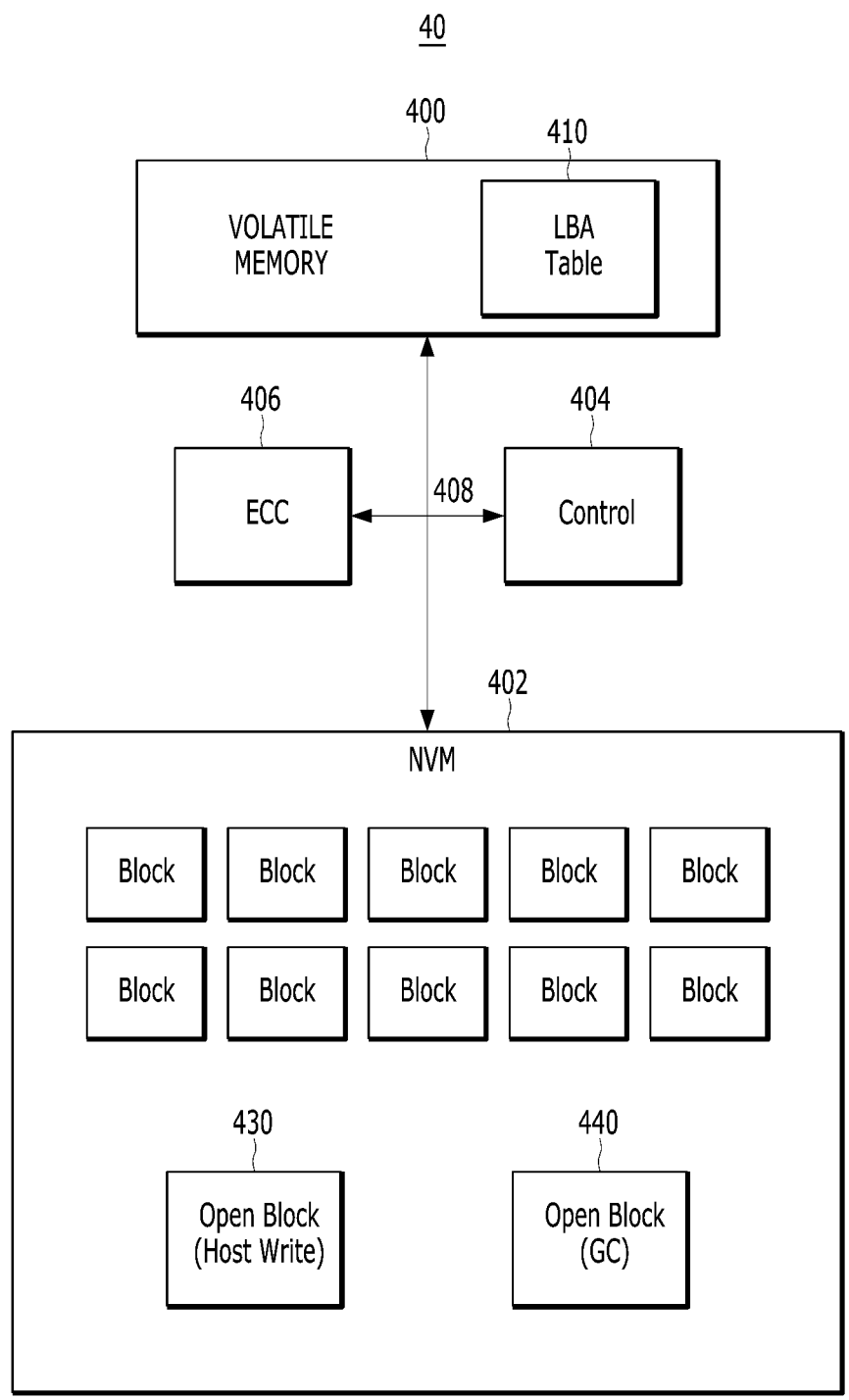
FIG. 4 is a diagram of an exemplary memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. The memory system 40 shows a general memory system. Additional/alternative components that may be utilized with memory systems to effectuate the present invention will be understood to those of skill in the art in light of this disclosure.

As referred to herein, terms such as "NAND" or "NVM" may refer to non-volatile memories such as flash memories which may implement error correcting code processes. Further, "DRAM" may refer to volatile memories which may include components such as controllers and ECC modules.

In embodiments of the present invention, the memory system 10 includes multiple decoders that are configured to decode low-density parity-check (LDPC) codes.

LDPC codes are a family of linear block forward error-correction (FEC) codes whose parity check matrix can be represented by a low-density parity-check matrix. LDPC codes are used extensively for providing data reliability in data storage and transmission applications.

There are many iterative decoding algorithms for LDPC codes, such as bit-flipping (BF) decoding algorithms, belief-propagation (BP) decoding algorithms, sum-product (SP) decoding algorithms, min-sum (MS) decoding algorithms, and Min-Max decoding algorithms.

Figure 5:
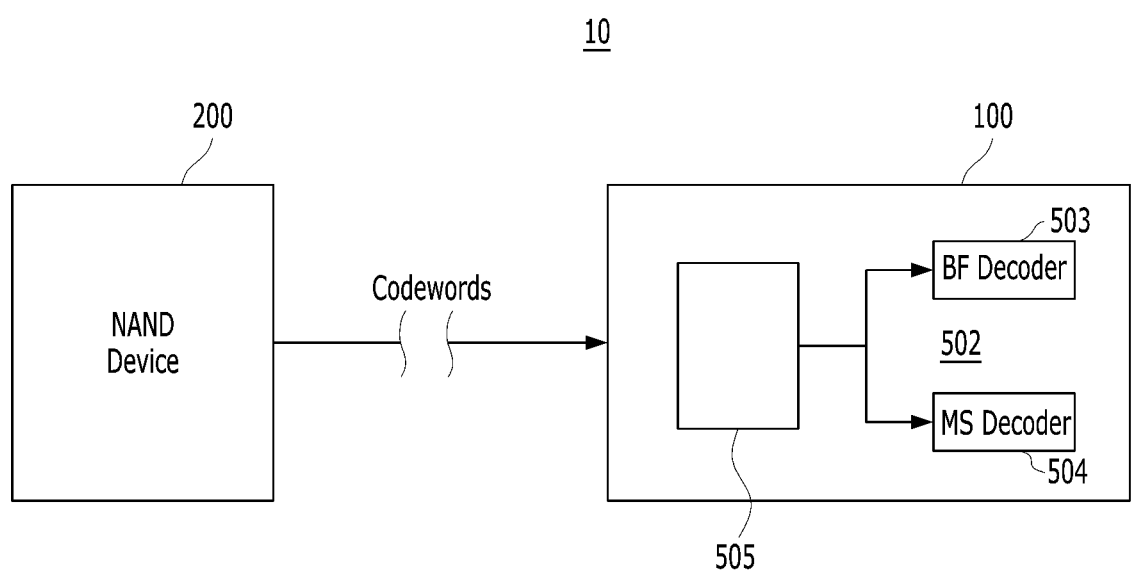
FIG. 5 is a diagram of an exemplary memory system including different decoders in accordance with an embodiment of the present invention.

In accordance with embodiments of the present invention, and as shown in FIG. 5, the memory system 10 may include the memory device 200, which may be a NAND device, and the memory controller 100. The memory system 10 may include decoding assembly 502, which includes a bit-flipping (BF) decoder 503 to execute a BF decoding algorithm to decode codewords read from the memory device 501 and a min-sum (MS) decoder 504 to execute an MS decoding algorithm. The BF decoder 503 and the MS decoder 504 may be embodied in the ECC component 130 (shown in FIG. 1) in the memory controller 100 or in any other suitable location. The codewords received from the memory device 200 by the memory controller 100 may be temporarily stored in a buffer or storage 505 of the memory controller 100 before being passed to one or the other of the decoders.

The memory system 10 may include other components (not shown) such as a checksum module, which computes checksums of codewords retrieved from the memory device 200 before decoding. The checksum module may be embodied within the memory controller 100 before the storage 505. The memory system 10 may further include cyclic redundancy check (CRC) modules disposed downstream of the BF decoder 503 and MS decoder 504, respectively. The CRC modules may be embodied within the memory controller 100.

With respect to the two decoding algorithms, MS decoding, performed by its associated decoder 504, is more powerful due to its higher complexity required to process soft input information. However, the less powerful BF decoding, performed by its associated decoder 503, is useful when the number of errors is low. Moreover, the BF decoder 503 can be used to reduce computational overhead by reducing the frequency for triggering the more powerful but more power consuming MS decoder 504.

In general, a BF decoder stores only the current value of each code-bit instead of storing soft information as an MS decoder does. The value of each code-bit may be flipped iteratively based on the information of the number of unsatisfied check-nodes for each code-bit. Different rules may be defined to decide whether code-bits are flipped or not.

Usually, in BF decoding algorithms, there are two factors used in determining whether and where a variable node needs to be flipped or not. The first factor may be referred to as the flipping indicator, given as u(j), of each variable node j. The second factor may be referred to a flipping threshold T. In each iteration, u(j) and T are calculated based on some rules. After calculating/determining u(j) and T, whether variable node j is to be flipped or not is based on the relationship between u(j) and T. For example, if u(j) is greater than T, variable node j is to be flipped. Otherwise, variable node j is still the same as the decision of a previous iteration.

In some designs, before decoding starts, the number of unsatisfied checks (USC) or syndrome weight before decoding of an LDPC codeword starts, is compared to a predetermined threshold T to estimate the noise level of the codeword. For example, if the USC is higher than T, the noise level is considered to be higher than what a BF decoder can process. In that case, the BF decoder is bypassed, and the codeword is provided to the MS decoder for decoding.

The inventors have discovered that USC, as a quality metric, sometimes fails to properly differentiate between decodable and undecodable codewords for a BF decoder. Moreover, the inventors have discovered the fundamental reason for this and, in the process, have invented a better quality metric to estimate decoding failure/success probability with a BF decoder.

Figure 6:
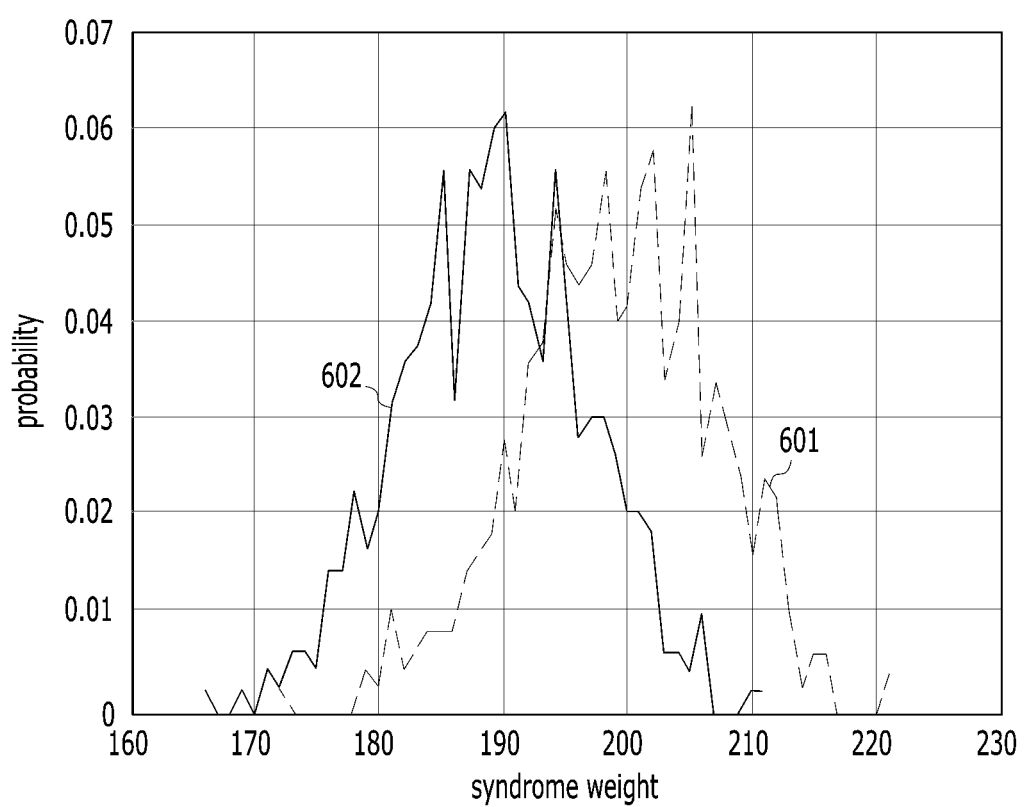
FIG. 6 is a graph showing syndrome weight distribution of decodable and undecodable codewords under a fixed weight error model.

Referring to FIG. 6, it illustrates a histogram of the syndrome weight vs. the probability of successful decoding. Syndrome weight distribution is shown under a fixed weight error model. Graph 601 shows the syndrome weight distribution before decoding starts of 500 successfully decoded codewords, and graph 602 shows such distribution of 500 codewords that failed to decode. That is, graph 601 depicts decoding success, and graph 602 depicts decoding failure. As can be seen, codewords that can be successfully decoded have statistically higher syndrome weights than those that fail decoding. If syndrome weight is used to determine which codewords should skip the BF decoder and be passed to the MS decoder, many codewords that could be successfully decoded by the BF decoder would not be sent the BF decoder but instead would be passed directly to the MS decoder. Doing so, however, is not only inefficient, it also causes higher MS decoder traffic and eventually higher power consumption and longer latency of the memory system, e.g., SSD.

The reason for this counter-intuitive phenomenon is that the cause of the decoding failure is not directly related to syndrome weight, as the inventors have discovered. In particular, the reason for decoding failure is interconnected errors, even though the number of errors may be low. For strongly interconnected errors, there are many mis-satisfied checks, so that they do not contribute to syndrome weight. Increasing the number of errors may increase the syndrome weight, but essentially, it is increases the probability of the occurrence of strongly interconnected error patterns.

Thus, instead of using only syndrome weight, the inventors developed a new quality metric to better estimate the probability of decoding failure/success. The idea is to jointly consider the initial syndrome weight and the BF decoder dynamic of the first few iterations. The inventors have found that the decodable and undecodable codewords can cause very different decoder dynamics.

The new quality metric is described as follows. The syndrome weight before decoding starts is denoted as s, and the BF decoder information after the i-th decoding iteration is denoted as: d[i], i=1, 2, 3 . . . .

Next, m is defined as a function of s, and d[i]: m= f(s, d[1], . . . , d[k]), where k is a predetermined small integer such as 1, 2 or 3.

The decoder information may include the total number of bits flipped, the hamming distance between receiving a codeword and a current hard decision, syndrome weight, how many bit flips have been performed in total, and the like.

Figure 7:
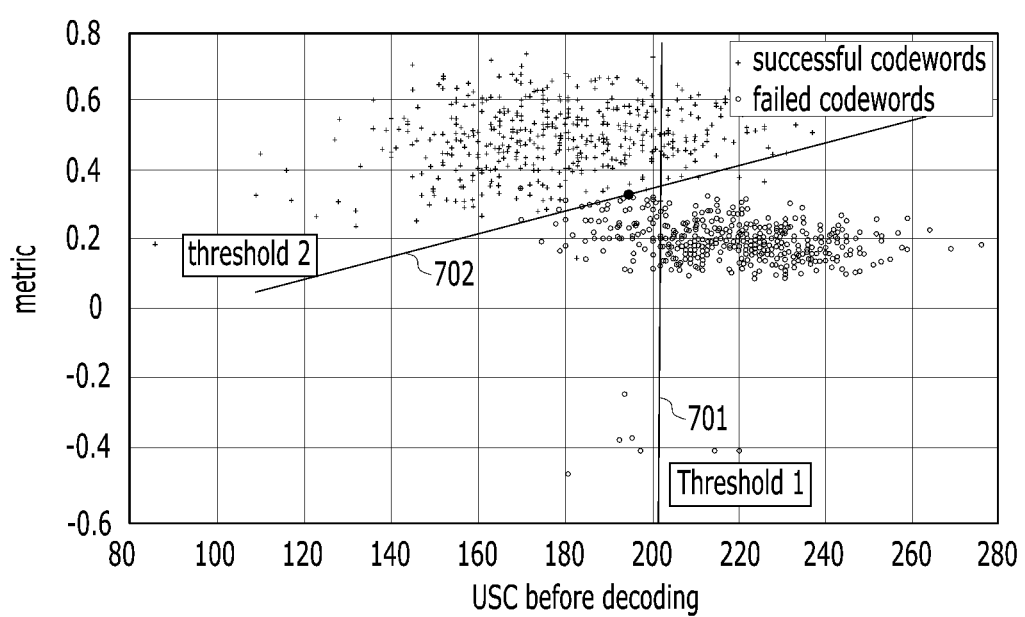
FIG. 7 is a graph showing distribution of successfully and unsuccessfully decoded codewords, using both initial syndrome weight and decoder information after an initial period of decoding to predict the probability of failure, as compared with using only initial syndrome weight.

FIG. 7 shows an example of successfully decoded codewords and failed codewords. As can be seen, if only the syndrome weight is used to predict the probability of failure, the optimum threshold is the vertical line 701, i.e., Threshold 1. The estimation, using Threshold 1, has a large error because there are many codewords for which BF decoding failed (failed codewords) that fall on the left side of Threshold 1, and there are many codewords for which BF decoding succeeded (successful codewords) that fall on the right side of Threshold 1.

In embodiments of the present invention, both initial syndrome weight s and d[i] (BF decoder information) are considered jointly as the quality metric. The optimum threshold for such quality metric is shown in FIG. 7 as line 702, i.e., Threshold 2. As can be seen, with the new quality metric, the estimation accuracy is improved significantly.

FIG. 8 is a flow chart describing steps in processes for decoding in accordance with an embodiment of the present invention. The steps shown in flow chart 80 are exemplary. Those skilled in the art will understand that additional or alternative steps may be performed, or that the order of the steps may be changed, in order to effectuate aspects of the present invention without departing from the inventive concepts disclosed herein. The steps of flow chart 80 may be performed by memory components disclosed herein, such a controller, DRAM, ECC component/module, and/or other suitable components.

Referring to FIG. 8, in conjunction with FIG. 5, exemplary processing is described.

At step 801, codewords are inputted from memory (e.g., NAND) device 200 to the controller 100. A checksum module may compute checksums of the codewords retrieved from the memory device 200 before they are inputted to the controller 100. Once inputted to the controller 100, the codewords may be stored in the storage 505.

At step 802, the controller 100 performs testing. During a test period, the BF decoder 503 runs multiple (e.g., 1-3) iterations of decoding to generate information of, or about, the BF decoder 503. Such information may include any of a number of characteristics as previously described.

The testing is continued in step 803, where the controller 100 determines a quality metric as a function of the information of the BF decoder 503 generated in step 802 and initial syndrome weight.

At step 804, the controller 100 applies that quality metric to each codeword retrieved from the memory device 200 after the test period. Based on application of the quality metric, it is determined at step 805 where to send each codeword. Whether to send a codeword first to the BF decoder 503, or to bypass the BF decoder 503, and send directly to the MS decoder 504 may be determined by comparing the number of USC of the codeword before decoding with a threshold.

Decoding is carried out at step 805. Based on application of the quality metric, the decoding may performed only by the BF decoder 503, only by the MS decoder 504, or by both. In the latter case, the BF decoder 503 is used first, and if decoding fails, then the MS decoder 504 is used.

As the foregoing describes, embodiments of the present invention provide efficient decoding, which may be employed in a memory system. Embodiments provide a solution to the weakness of using USC or syndrome weight alone as a quality metric. A new and better quality metric, in accordance with embodiments of the present invention, provides an improved estimate as to the probability of decoding failure/success. Embodiments of the present invention provide better quality of service and reduce latency.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system, comprising
a memory device; and
a controller in communication with, and configured to control, the memory device, the controller comprising
a storage configured to store codewords read by the controller from the memory device,
a bit-flipping (BF) decoder in communication with the storage, and
a min-sum (MS) decoder in communication with the storage;
wherein, in a test period, the controller is configured to determine a quality metric as a function of initial syndrome weight and information of the BF decoder after a set number of decoding iterations by the BF decoder, and
wherein, after the test period, the controller is configured to apply the quality metric to each codeword retrieved after the test period to determine whether to send that codeword first to the BF decoder for decoding or to the MS decoder for decoding.

2. The memory system of claim 1, wherein the information of the BF decoder includes total number of bits flipped for a select codeword, hamming distance between receiving the select codeword and a hard decision on the select codeword, syndrome weight, and total number of bits flipped for all codewords during the test period.

3. The memory system of claim 1, wherein the set number of decoding iterations in the test period is 1, 2 or 3.

4. The memory system of claim 1, wherein, in determining the quality metric in the test period, the controller determines a threshold with respect to a number of unsatisfied checks (USC) during the test period.

5. The memory system of claim 4, wherein in determining whether to send a select codeword first to the BF decoder for decoding or to the MS decoder for decoding after the test period, the controller compares the number of USC for the select codeword, before decoding, with the threshold.

6. The memory system of claim 5, wherein, when the number of USC for the select codeword is higher than the threshold, the controller sends the select codeword to the MS decoder first, bypassing the BF decoder.

7. The memory system of claim 5, wherein, when the number of USC for the select codeword is lower than the threshold, the controller sends the select codeword to the BF decoder first.

8. The memory system of claim 7, wherein the controller sends the select codeword to the MS decoder after the BF decoder when the BF decoder fails to successfully decode the select codeword.

9. A controller, comprising:
a storage configured to store codewords read by the controller from a memory device; and
a decoding assembly in communication with the storage, the decoding assembly comprising a bit-flipping (BF) decoder and a min-sum (MS) decoder;
wherein, in a test period, the controller is configured to determine a quality metric as a function of initial syndrome weight and information of the BF decoder after a set number of decoding iterations by the BF decoder, and
wherein, after the test period, the controller is configured to apply the quality metric to each codeword retrieved after the test period to determine whether to send that codeword first to the BF decoder for decoding or to the MS decoder for decoding.

10. The controller claim 9, wherein the information of the BF decoder includes total number of bits flipped for a select codeword, hamming distance between receiving the select codeword and a hard decision on the select codeword, syndrome weight, and total number of bits flipped for all codewords during the test period.

11. The controller of claim 9, wherein, in determining the quality metric in the test period, the controller determines a threshold with respect to a number of unsatisfied checks (USC) during the test period.

12. The controller of claim 11, wherein in determining whether to send a select codeword first to the BF decoder for decoding or to the MS decoder for decoding after the test period, the controller compares the number of USC for the select codeword before decoding with the threshold.

13. The controller of claim 12, wherein, when the number of USC for the select codeword is higher than the threshold, the controller sends the select codeword to the MS decoder first, bypassing the BF decoder, and when the number of USC for the select codeword is lower than the threshold, the controller sends the select codeword to the BF decoder first.

14. A method of operating a memory system, comprising
inputting codewords from a memory device of the memory system to a controller of the memory system;
performing multiple iterations of decoding by a bit-flipping (BF) decoder of the memory system during a test period to generate information of the BF decoder;
determining a quality metric as a function of the information of the BF decoder and initial syndrome weight;
applying the quality metric to each codeword retrieved from the memory device by the controller after the test period; and
determining whether to send each codeword, based on the applying, first to the BF decoder for decoding or to a min-sum (MS) decoder of the memory system for decoding.

15. The method of claim 14, wherein the information of the BF decoder includes total number of bits flipped for a select codeword, hamming distance between receiving the select codeword and a hard decision on the select codeword, syndrome weight, and total number of bits flipped for all codewords during the test period.

16. The method of claim 14, wherein the determining of the quality metric further comprises determining a threshold with respect to a number of unsatisfied checks (USC) during the test period.

17. The method of claim 16, wherein the determining of whether to send each codeword, based on the applying, first to the BF decoder for decoding or to the min-sum (MS) decoder for decoding, further comprises comparing the number of USC for the select codeword, before decoding, with threshold.

18. The method of claim 17, wherein, when the result of the comparing is that the number of USC for the select codeword is higher than the threshold, the method further comprises sending the select codeword to the MS decoder first, bypassing the BF decoder.

19. The method of claim 17, wherein, when the result of the comparing is that the number of USC for the select codeword is lower than the threshold, the method further comprises sending the select codeword to the BF decoder first.

20. The method of claim 19, wherein, after sending the select codeword to the BF decoder, the method further comprises sending the select codeword to the MS decoder when the BF decoder fails to successfully decode the select codeword.

* * * * *